United States Patent [19]

Cheung et al.

[11] Patent Number: 5,117,469
[45] Date of Patent: May 26, 1992

[54] POLARIZATION-DEPENDENT AND POLARIZATION-DIVERSIFIED OPTO-ELECTRONIC DEVICES USING A STRAINED QUANTUM WELL

[75] Inventors: Kwok-wai Cheung, Red Bank; Chung-en Zah, Marlboro, both of N.J.

[73] Assignee: Bell Communications Research, Inc., Livingston, N.J.

[21] Appl. No.: 649,659

[22] Filed: Feb. 1, 1991

[51] Int. Cl.$^5$ .............................................. G02B 6/10
[52] U.S. Cl. ........................... 385/11; 357/30; 359/488; 372/45; 385/131
[58] Field of Search ............... 350/96.11, 96.12, 96.13, 350/96.14, 96.15, 96.16, 370, 394, 395; 357/17, 19, 30; 372/45; 385/11, 129, 130, 131; 359/483, 485, 487, 488

[56] References Cited

U.S. PATENT DOCUMENTS

| | | | |
|---|---|---|---|
| 4,612,645 | 9/1986 | Liu et al. | 372/45 |
| 4,746,181 | 5/1988 | Hayakawa et al. | 350/96.12 |
| 4,827,320 | 5/1989 | Morkoc et al. | 357/22 |
| 4,904,045 | 2/1990 | Alferness et al. | 350/96.12 X |
| 4,941,025 | 7/1990 | Tabatabaie | 357/16 |
| 4,952,792 | 8/1990 | Caridi | 357/30 X |
| 4,984,242 | 1/1991 | Scifres et al. | 357/16 X |
| 5,021,360 | 6/1991 | Melman et al. | 437/81 |
| 5,040,186 | 8/1991 | Logan et al. | 372/45 |

OTHER PUBLICATIONS

Y. Shani et al., "integrated Optic Front End for Polarization Diversity Reception," *Applied Physics Letters*, May 1990, vol. 56, pp. 2092-2093.

J. S. Weiner et al., "Highly Anisotropic Optical Properties of Single Quantum Well Waveguides," *Applied Physics Letters*, Oct. 1985, vol. 47, pp. 664-667.

F. S. Choa et al., "Optoelectronic Properties of InGaAs/InGaAsP Multiple-Quantum-Well Waveguide Detectors", *IEEE Photonics Technology Letters*, Nov. 1989, vol. 1, pp. 376-378.

C. E. Zah et al., "Submilliampere-Threshold 1.5 μm Strained-Layer Multiple Quantum Well Lases," *IEEE Photonics Technology Letters*, Dec. 1990, vol. 2, pp. 852-853.

A. Futamata et al., "Optimization of Magneto-Optic Head," *Optical Data Storage*, Mar. 1990, Proceedings SPIE, vol. 1316, pp. 136-142.

M. Yamanishi et al., "Comment on Polarization Dependent Momentum Matrix Elements in Quantum Well Lasers," *Japanese Journal of Applied Physics*, Jan. 1984, vol. 23, pp. L35-L36.

C. E. Zah et al., "Performance of 1.5 μm λ/4-shifted DFB-SIPBH Laser Diodes with Electron Beam Defined and Reactive Ion-Etched Gratings," *Electronics Letters*, May 1989, vol. 25, pp. 650-651.

(List continued on next page.)

*Primary Examiner*—John D. Lee
*Attorney, Agent, or Firm*—Leonard Charles Suchyta; Charles S. Guenzer

[57] ABSTRACT

A polarized semiconductive optical detector, laser, or amplifier in which the active layer includes a strained quantum well such that the strain splits the valence band so as to provide anisotropic absorption (and gain under population inversion) for two linear polarizations of light. The bands are split about the energy of the light so that the polarized device absorbs and thus detects, amplifies, or lases only one of the polarizations. To form a polarization-diversity detector, the polarized detector is set serially first on an optical waveguide, and a non-polarized or oppositely polarized detector is set serially second on the waveguide so as to detect the non-absorbed light of the other polarization. Such a polarization-diversity detector can be used to form a simple optical-disk pickup head or an array of pickup heads. A pair of such polarization diversity detectors can advantageously be comined with a 3 dB splitter and a local-oscillator laser to form a simple coherent receiver. by the same techniqes, dual-polarization lasers, polarization-multiplexed transceivers, and polarization-insensitive amplifiers are made possible.

14 Claims, 6 Drawing Sheets

OTHER PUBLICATIONS

P. L. Gourley et al., "Lasing Transitions in GaAs/GaAs$_{1-x}$P$_x$ Strained-Layer Superlattices with x=0.1-0.5," *Applied Physics Letters*, 1985, (Sep.) vol. 47, pp. 552-554.

K. Sato et al., "TM-Mode Gain Enhancement in InGaAs/InP Lasers with Tensile Strained-Layer Superlattice," Conference Digest, 12th IEEE International Semiconductor Laser Conference, 1990, (Sep.) pp. 48-49.

T. Tanbun-Ek et al., "Performance Enhancement of InGaAs/InP Quantum Well Lasers by Both Tensile and Compressive Strain," *Conference Digest*, 12th IEEE International Semiconductor Laser Conference, 1990, (Sep.) pp. 46-47.

H. Temkin et al., "High Temperature Operation of Lattice Matched and Strained InGaAs-InP Quantum Well Lasers," *IEEE Photonics Technology Letters*, Feb. 1991, vol. 3, pp. 100-102.

T. Tanbun-Ek et al., "Measurements of the Polarization Dependent of the Gain of Strained Multiple Quantum Well InGaAs-InP Lasers," *IEEE Photonics Technology Letters*, Feb. 1991, vol. 3, pp. 103-105.

POLARIZATION-DEPENDENT AND POLARIZATION-DIVERSIFIED OPTO-ELECTRONIC DEVICES USING A STRAINED QUANTUM WELL

FIELD OF THE INVENTION

The invention relates generally to semiconductor opto-electronic devices including detectors, amplifiers, and lasers; in particular, it relates to polarization-preferential optical devices, which are particularly useful in a coherent polarization-diversified receiver.

BACKGROUND ART

The use of single-mode optical fibers in communication systems has introduced a number of problems involving polarization sensitivity at the receiver end of the fiber. Present-day single-mode fibers are used to propagate only a single mode at a given frequency. Even if that mode is launched into the fiber in a set linear polarization, at the receiver end, there is no control over the polarization angle, and, indeed, the polarization angle at the output end of the fiber changes seemingly randomly over relatively short times.

Direct optical detectors measure the intensity of the optical signal over an averaging time substantially longer than the period of the optical carrier. Most direct optical detectors are polarization insensitive so that it does not matter which polarization state the mode has assumed. However, the polarization problem arises in wavelength-division multiplexing (WDM) systems in which the fiber carries multiple optical signals at different carrier frequencies. A WDM receiver using direct optical detection must optically filter the multi-frequency WDM signal to pass only the desired channel to the direct optical detector. However, most economical, narrow-band, and tunable optical filters are polarization-sensitive. That is, the degree of transmission will depend on the angle of linear polarization of the light. A WDM receiver using such a polarization-sensitive filter will experience signal fading as the polarization state of the desired channel randomly changes over time. Therefore, there has been a great effort at developing polarization-insensitive and tunable optical filters.

On the other hand, coherent optical detection relies on a local optical oscillator outputting an unmodulated reference signal at the optical carrier frequency. Coherent detection detects the polarization component of the data signal that is in phase with the component of the reference signal having the same polarization. Coherent detection allows the detection of signals of low power levels which direct detection could not distinguish from the noise. However, the lack of control over polarization in the optical fiber requires that the coherent detection be polarization-diversified. Shani et al. have disclosed a polarization-diversified coherent receiver in "Integrated optic front end for polarization diversity reception," Applied Physics Letters, volume 56, 1990, pages 2092-2093. The architecture for such an integrated receiver is illustrated in FIG. 1. A first optical waveguide 10 carries the data signal, and a second optical waveguide 12 carries the local oscillator (LO) signal polarized at 45° to the TE and TM directions. That is, the LO signal contains equal amounts of TE and TM modes. The data and LO signals are combined in a 3 dB splitter 14. Both waveguides 10 and 12 are then carrying equivalent amounts of both signals. The waveguides 10 and 12 are led into respective polarization splitters 16 and 18, in which the TM modes are transferred to third and fourth waveguides 20 and 22 respectively while the TE modes remain on the first and second waveguides 10 and 12. Four direct optical detectors 24 detect the intensities on the four waveguides 10, 12, 20, and 22 and output respective electrical signals $I_1$, $I_2$, $I_3$, and $I_4$. These four electrical signals can be combined to provide balanced outputs:

$$I_1 - I_2 \propto (2P_sP_l)^{\frac{1}{2}} \sin \theta \tag{1}$$

and $$I_3 - I_4 \propto (2P_sP_l)^{\frac{1}{2}} \cos \theta, \tag{2}$$

where $P_s$ is the optical power of the data signal and $P_l$ is the optical power of the LO signal, that is, the magnitudes of the vector sum of the respective TE and TM modes, and $\theta$ is the polarization angle of the data signal relative to the polarization state of the LO signal. The balanced outputs are based on differences in currents and reduce the effect of LO noise. These balanced outputs can then be used to generate the polarization diversified output $$(I_1 - I_2)^2 + (I_3 - I_4)^2 \propto 2P_sP_l \tag{3}$$

Since $P_l$ is assumed to be constant, the polarization-diversified output provides the time dependence of the data signal $P_s$ even when its polarization state $\theta$ is varying over time.

The conventional polarization diversified receiver suffers several disadvantages. It requires three splitters 14, 16, and 18, each having approximately the illustrated structure. The splitters occupy more than ten times the surface area occupied by the detectors 24. The waveguides forming the splitters must be bent to separate the optically coupled region from the optically isolated regions. Each bend is large and causes loss in the optical signals.

Weiner et al. have disclosed differences in absorption of TE and TM modes propagating in a waveguide having a central quantum well in "Highly anisotropic optical properties of single quantum well waveguides," Applied Physics Letters, volume 47, 1985, pages 664-667. Although they did not describe any useful devices, they suggested that the effect had potential application to polarization-sensitive devices. Similarly, Choa et al. disclose the polarization sensitivity of an unstrained quantum-well detector in "Optoelectronic properties of InGaAs/InGaAsP multiple-quantum-well waveguide detectors," IEEE Photonics Technology Letters, volume 1, 1989, at pages 376-378. They, however, fail to take advantage of the polarization properties.

SUMMARY OF THE INVENTION

Accordingly, an object of the invention is to provide a polarization-sensitive optical detector.

Another object of the invention is to provide a polarization-diversified optical receiver having fewer components than are required in the prior art.

Yet another object of the invention is to provide a direct optical detector allowing such a reduction in receiver complexity.

A yet further object of the invention is to provide a polarization-insensitive optical amplifier or a dual-polarization laser usable as a local oscillator with a polarization-diversified optical receiver.

The invention can be summarized as a strained quantum-well optical opto-electronic device which preferentially absorbs one polarization of light propagating in a waveguide and either converts it to an electrical signal, amplifies it, or lases. Such a polarization-sensitive detector can be incorporated into a polarization diversified receiver by placing it as a first detector on a waveguide and placing a second non-polarization-sensitive detector further along the waveguide, thereby eliminating the need for polarization splitters. It can also be used as a simple optical-disk pickup.

BRIEF DESCRIPTION OF THE DRAWINGS

In the drawings, like reference numerals refer to like elements, unless otherwise specified.

DETAILED DESCRIPTION OF THE PREFERRED EMBODIMENTS

Figure 1:
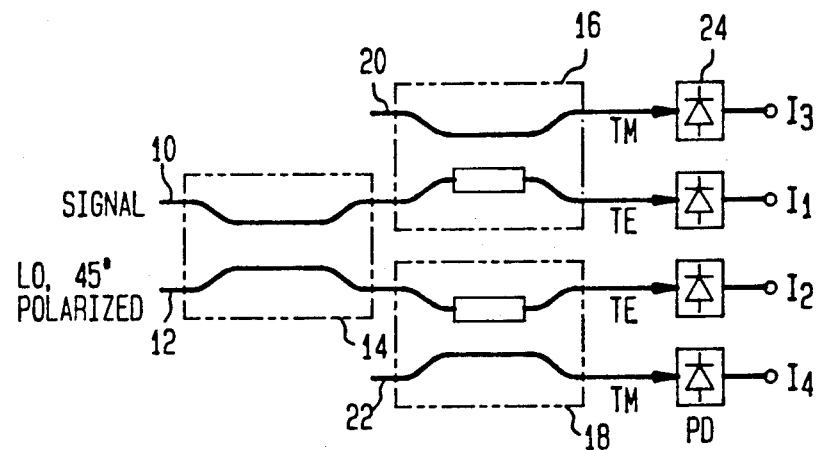
FIG. 1 is a plan view of a balanced polarization diversified optical receiver integrated into a circuit.

The present invention takes advantage of the band splitting introduced by strain in a strained quantum-well detector or other opto-electronic device. For example, as illustrated in cross section in FIG. 2, a strained quantum well is formed by a thin quantum-well layer 30 of $In_xGa_{1-x}As$, $x \neq 0.53$, sandwiched between and epitaxial with thick lower and upper barrier layers 32 and 34 of InGaAsP quaternary lattice-matched to InP, to which $In_{0.53}Ga_{0.47}As$ is lattice-matched. The lattice constant of the $In_xGa_{1-x}As$ varies with the alloying fraction x so that the quantum-well layer 30 is strained, and in compressive strain for $x > 0.53$. If the $In_xGa_{1-x}As$ material were unstrained, as illustrated on the left of FIG. 3, the heavy hole band 36 and the light hold band 38 would be degenerate at the $\Gamma$ point ($k=0$) and the absorption would be isotropic in all polarizations. However, as illustrated on the right of FIG. 3, uniaxial stress $\epsilon$ removes the degeneracy of the heavy and light hole bands 36 and 38. The planar structure of FIG. 2 in fact introduces biaxial strain. However, biaxial strain can be expressed as a sum of hydrostatic strain, which maintains the symmetry of the band structure, and uniaxial strain, which breaks the symmetry. Disregarding quantum size effects, the energy separation between these two bands if given by:

$$\Delta_{hh-lh} = 2b\left(1 + 2\frac{C_{12}}{C_{11}}\right)\epsilon \quad (4)$$

where b is the deformation potential, $C_{11}$ and $C_{12}$ are the elastic moduli, and $\epsilon$ is the biaxial strain in the direction parallel to the interface. This same general effect occurs in the $Ga_{1-x}In_xAs_yP_{1-y}$ material system.

For the $In_xGa_{1-x}As$ material system, the above constants can be interpolated from the values for GaAs and InAs so that $$\Delta_{hh-lh} \approx 75(meV) \times \epsilon(\%). \quad (5)$$

Then, the biaxial strain $\epsilon$ is given as a function of the indium mole fraction x in the quantum-well layer 30 by Vegard's law $$\epsilon = 6.9(x-53)\% \quad (6)$$

when the alloying fraction x is expressed as a percentage.

For the strained quantum well 30, the absorption edge for light electrically polarized parallel to the quantum-well plane 40, that is, the TE mode, is determined by both the transition energy from the electron band 42 to the heavy hole band 36 (the electron/heavy-hole transition (ehh)) and the transition energy from the electron band 42 to the light hole band 38 (the electron/light-hole transition (elh)), but the absorption edge for light polarized perpendicular to the quantum-well plane 40, that is, the TM mode, is determined only by the transition energy from the electron band 42 to the light hole band 38. As illustrated on the right of FIG. 3 for biaxial compressive strain $\epsilon$, the heavy hole band 36 is above the light hole band 38 and the energy separation $\Delta_{hh-lh}$ between the two bands 36 and 38 can be made larger than 2kT (52 meV at room temperature). Then, if the wavelength $\lambda$ of light is chosen such that its energy $hv = hc/\lambda$ falls between the electron/light-hole transition (elh) and the electron/heavy-hole transition (ehh), the strained quantum-well provides highly anisotropic absorption between the TE and TM modes. Moreover, under biaxial compressive strain, the quantum-size effect further increases the actual separation $\Delta_{hh-lh}$ between the heavy and light hole bands 36 and 38 over the value of Equation (4).

Figure 2:
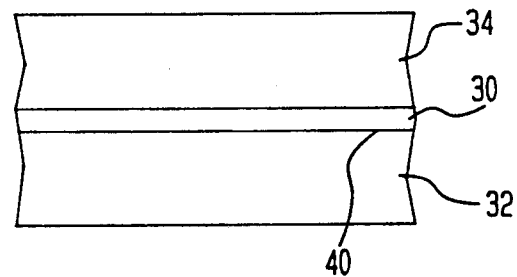
FIG. 2 is a cross-sectional view of a strained quantum well useful for explaining the operation of the invention.

The structure of FIG. 2 is somewhat conceptual in nature and requires additional structure for efficient operation. A polarization-diversified receiver 48, illustrated in transverse cross-sections in FIGS. 4 and 5, uses a substrate 50 of semi-insulating InP for further epitaxial growth by low-pressure organo-metallic chemical vapor deposition (OMCVD), generally following the procedures described by Zah et al. in "Submilliampere-threshold 1.5—$\mu$m strained-layer multiple quantum well lasers," IEEE Photonics Technology Letters, volume 2, 1990, pages 852-853. An n+ 1.1—$\mu$m quaternary lower contact layer 52 of 1 $\mu$m thickness is deposited on the substrate 50. By 1.1—$\mu$m quaternary is meant a III-V semiconductor having a composition $Ga_{1-x}In_xAs_yP_{1-y}$ with x and y selected such that it has a bandgap with a 1.1 $\mu$m absorption edge and is lattice-matched to InP. Then an n-type lower InP layer 54 is deposited to a thickness of 2 $\mu$m, on which is deposited a lower GRINSCH (graded-index separate confinement heterostructure) waveguide layer 56 consisting, from the bottom to the top, of 60 nm of undoped 1.0 μm quaternary, 50 nm of undoped 1.1 μm quaternary, 40 nm of undoped 1.2 μm quaternary, and 30 nm of undoped 1.3 μm quaternary.

In a polarized waveguide detector region 58 and an isolation region 60, an active layer 62 is grown as a multiple quantum-well layer consisting of three layers of biaxially compressively strained $In_xGa_{1-x}As$ wells separated by two barriers of undoped 1.3−μm quaternary of 10 nm thickness. Only two quantum wells and one intermediate barrier are illustrated. The quantum-well thickness is about 2 nm, and the amount of biaxial strain in the wells is about 1.7% in compression, corresponding to an alloying fraction $x=0.78$.

On the other hand, in a conventional waveguide detector region 64, the active layer 62 is grown as an undoped and unstrained $In_{0.53}Ga_{0.47}As$ layer of 150 nm thickness lacking any barrier layers or different alloying percentage $x \neq 0.53$ that would induce strain. In the passive waveguide region 66 before the detectors, the active layer 62 is grown of a quaternary that is transparent to the wavelength being detected, that is, transparent to both the TE and TM modes. The different growths in the active layer 62 are accomplished by etch and regrowth, in which the vertical structure for one region is grown over a broad area, then masked in the area in which it is desired and the exposed structure is etched away, followed by regrowth of the second vertical structure in the etched away area. The length of the polarized waveguide detector region 58 may be selected to be 400 μm, the length of the isolation region 60 to be 50 μm, and the length of the conventional waveguide detector region 64 to be 50 μm.

An upper GRINSCH waveguide layer 68 is grown over the active layer 62 in reversed order from the lower waveguide layer 56. The two waveguide layers 56 and 68 and the active layer 62 compose a waveguide 70.

Figure 4:
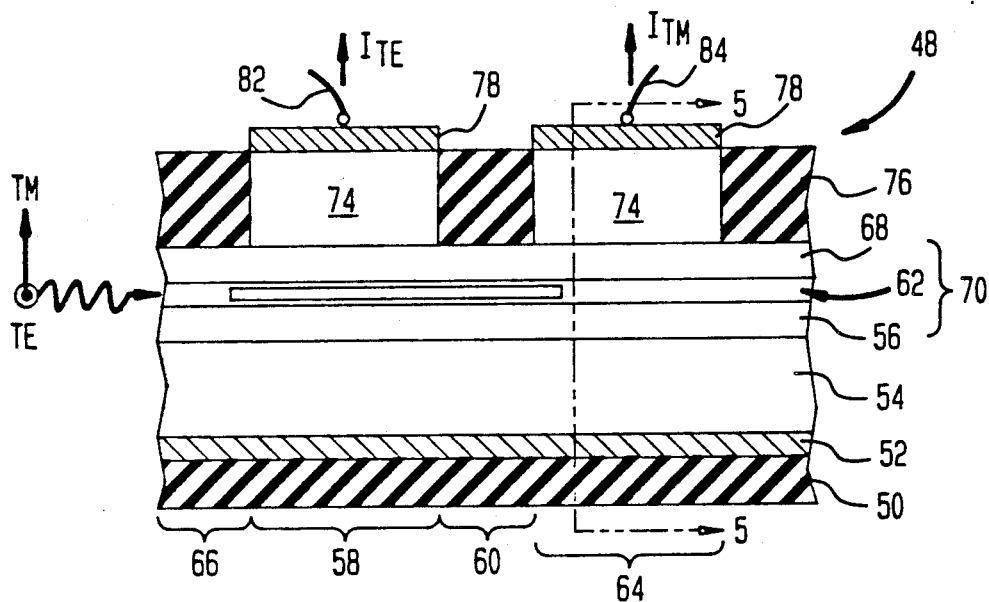
FIG. 4 is a longitudinal cross-sectional view of a polarization diversified detector including a polarized waveguide detector taken along a longitudinal axis of the waveguide.
Figure 5:
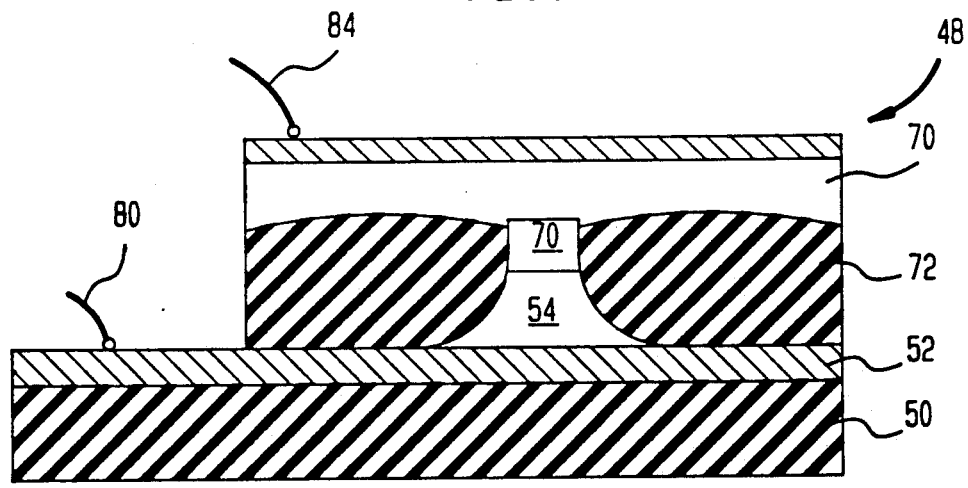
FIG. 5 is a transverse cross-sectional view of the detector of FIG. 4 taken along the cross section 5—5.

As illustrated in FIG. 5, the waveguide 70 is laterally defined to a width of 1.5 μm by covering the area of the waveguide 70 with an $SiO_2$ mask, etching down to the lower contact layer 52, and regrowing a semi-insulating InP layer 72 up to the top of the waveguide 70. Concurrently, a semi-insulating InP layer 76, shown in FIG. 4, is also regrown in the isolation region 60 and the passive waveguide region 66 by locally removing the $SiO_2$ mask between the two detector regions 58 and 64 and over the passive waveguide region 66. A p-type upper layer 74 of InP is grown to a thickness of 2 μm. A p+ 1.3−μm quaternary contact layer 78 is deposited to a thickness of 0.2 μm and is lithographically removed over the isolation region 60 separating the two detector regions 58 and 64. A lower contact is provided by etching a side region down to the n+ lower contact layer 52 and attaching a common counter electrical lead 80 although separate counter electrodes could be provided by deeper etching and multiple leads 80. Electrical leads 82 and 84 are respectively connected to the polarized waveguide detector 58 and the conventional waveguide detector 64.

Figure 3:
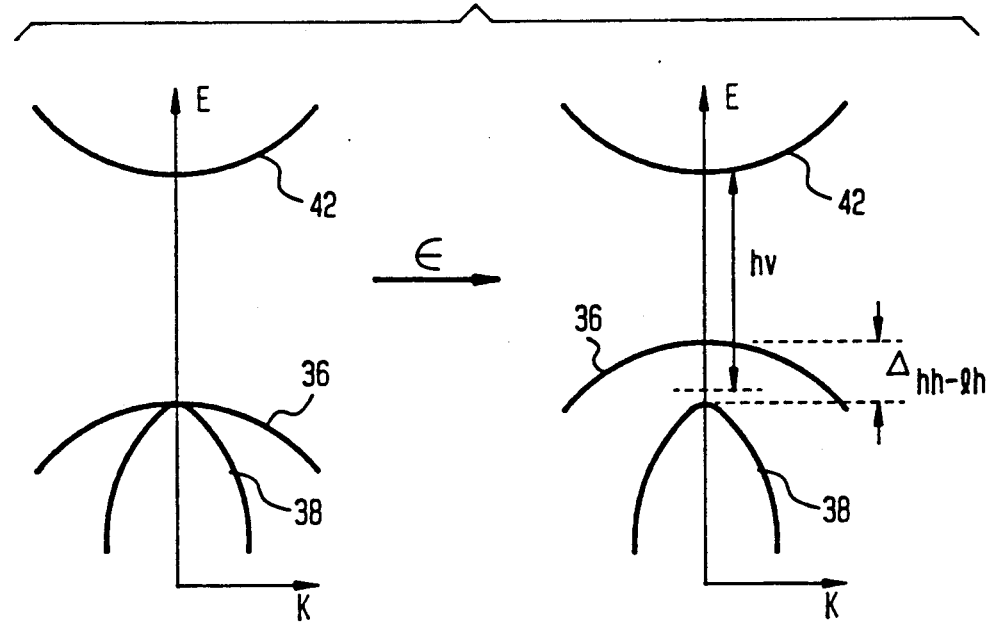
FIG. 3 illustrates band structures for unstrained and uniaxially strained semiconductors.

The conventional waveguide detector 64 does not have a strained active layer so that its band structure is that of the left side of FIG. 3. Therefore, it responds isotropically to TE and TM radiation. The serial combination of the polarized waveguide detector 58, sensitive to and absorbing TE radiation, and the conventional waveguide detector 64 forms a polarization-diversity detector 48 having the advantage that both the TE and TM modes can be separately detected without the use of splitters as long as the energy (wavelength) of the light falls between the absorption edges of the two polarizations of the polarized detector 58. The electrical lead 82 for the polarized detector 58 provides a current $I_{TE}$ proportional to the optical power of the TE mode, while the lead 84 for the conventional detector 64 provides a current $I_{TM}$ proportional to the remaining optical power, which is primarily TM polarized. We believe that the described embodiment provides an absorption edge of 1.54 μm for the TE mode and 1.4 μm for the TM mode in the polarized detector 58.

The angle of the polarization state of the light can be determined as follows by analyzing the two currents generated by the two detectors 58 and 64:

$$\frac{I_{TM}}{I_{TE}} \approx \frac{\sin(\theta_0 + \Delta\theta_0)}{\cos(\theta_0 + \Delta\theta)}, \quad (7)$$

which for $\theta_0 = 45°$ $$= \frac{1 + \tan(\Delta\theta)}{1 - \tan(\Delta\theta)} \quad (8)$$

$$\approx 1 + 2\Delta\theta,$$

where $\Delta\theta$ is the change of the signal polarization state from the biased polarized state of $\theta_0$.

EXAMPLE 1

The concept of the invention was verified by fabricating a polarized waveguide detector 58, as illustrated in FIG. 4, but without the conventional waveguide detector 64 or other non-detecting waveguide 66. The cavity length 58 was 750 μm. Laser light having a wavelength of 1.496 μm was injected by a lensed single mode optical fiber. Light which passed through the polarized waveguide detector 58 under zero bias was detected by a separate large-area Ge photodiode via another optical fiber. First, the laser light was established to be TM polarized by adjusting a polarization controller on the input fiber for maximum response of the Ge photodiode. Then, with the bias on the polarized detector 58 set to zero (although it could have been reversed biased), the photocurrent signals on both the polarized detector 58 and the Ge photodiode were measured as a function of the rotation angle of a half-wave plate inserted between the laser and the input optical fiber. The rotation of the half-wave plate caused a rotation of the polarization of the injected light. The response of the TE polarized detector 58 to TM light showed more than 90% reduction (−11 dB) from its response to TE light, while the response of the Ge photodiode to TE light was reduced almost 100% from its response to TM light, that is, the polarized detector 58 was absorbing all the TE radiation. The external quantum efficiency for the TE mode in the polarized detector 58 including the fiber coupling loss was measured to be 0.48 A/W (40%), and its internal quantum efficiency was estimated to be close to 100%. The absorption loss for the TM mode within the polarized detector was estimated to be 4 dB, which could be reduced by shortening the cavity length.

Figure 6:
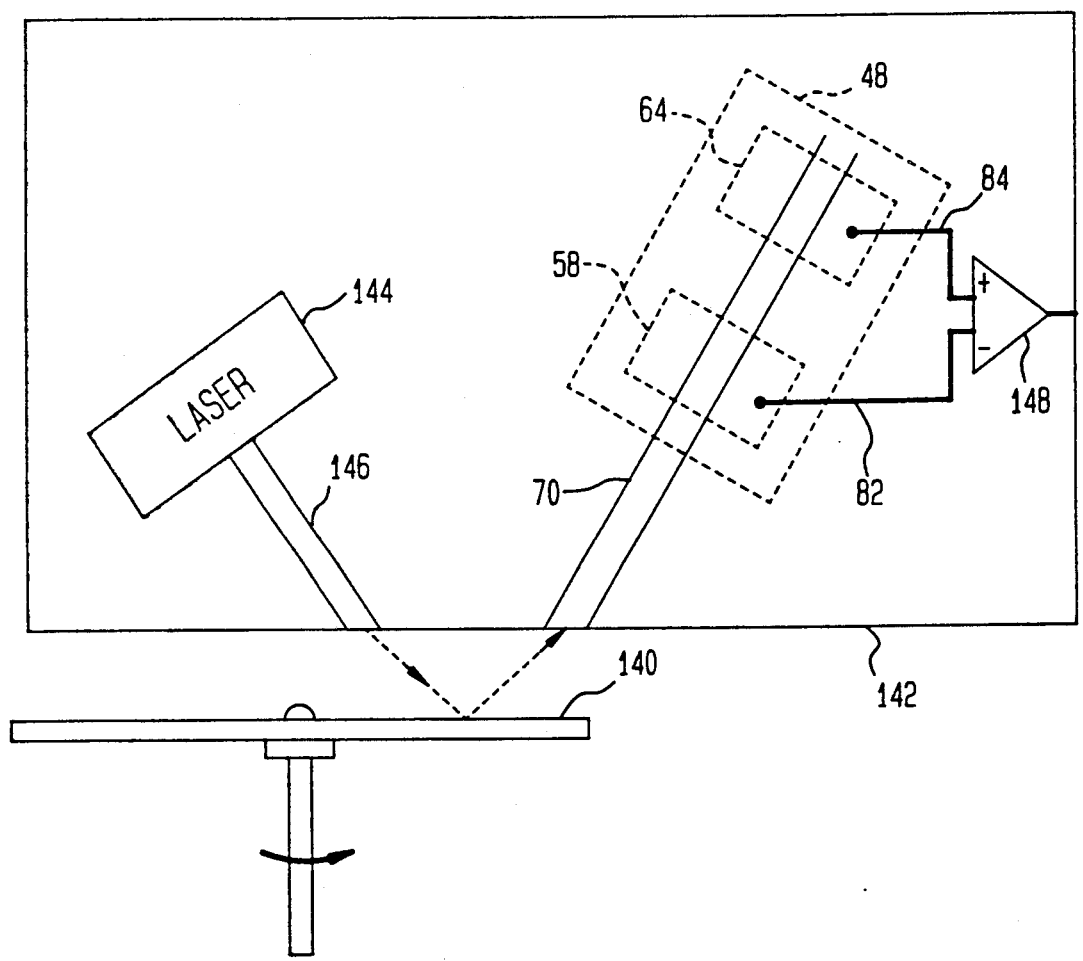
FIG. 6 is a plan and schematic view of a magnetic-optical pickup.

As illustrated in a combined schematic and plan view in FIG. 6, a polarization diversified receiver 48 can be used in a pickup to read out the information from a rotating magneto-optical disk 140 by detecting changes Δθ in the polarization state of the laser beam reflected from the disk 140, a method generally disclosed by Futamata et al. in "Optimization of magneto-optic head," Optical Data Storage, Proceedings SPIE, volume 1316, 1990, pages 136–142. The polarization diversified receiver 48 is integrated on an OEIC (opto-electronic integrated circuit) chip 142, which also includes a laser 144 outputting radiation of a fixed polarization state onto a waveguide 146. The laser waveguide 146 and the detector waveguide 70 extend to the edge of the chip 146 so as to respectively emit and receive radiation, and their optical axes (adjusted for refraction at the semiconductor/air interface) intersect at the surface of the recorded magneto-optical disk 140. A divider 148 obtains the ratio of the TE output from the TE detector 58 to the TM output from the TM detector 64 to provide an output signal indicating the degree of polarization rotation Δθ produced by the local area of the disk 140, that is, what data was written there. A large number of diversified receivers 48 could be integrated as an array on the OEIC chip 142.

Figure 7:
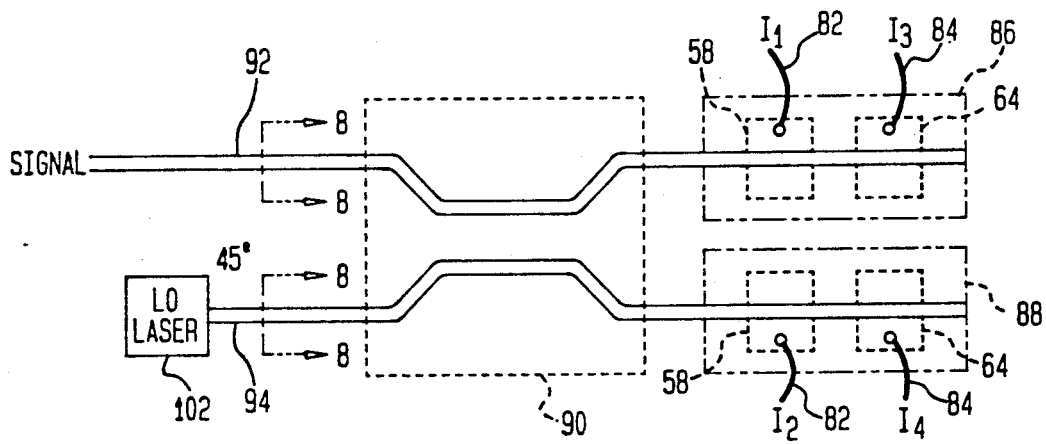
FIG. 7 is a plan and schematic view of an integrated polarization-diversified coherent receiver.
Figure 8:
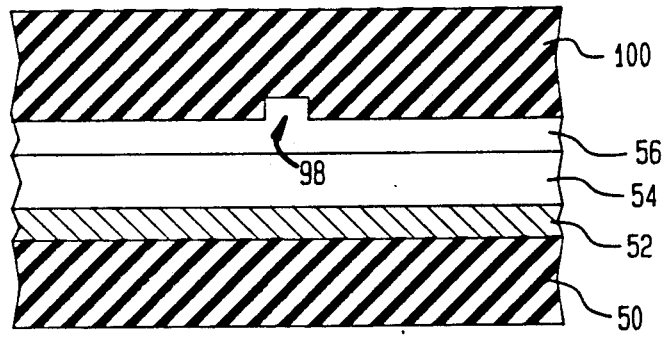
FIG. 8 is a cross-sectional view of the receiver of FIG. 6 taken along either of the cross-sectional lines 8—8.

As illustrated in plan view in FIG. 7, a pair of polarization-diversified detectors 86 and 88 can be monolithically integrated with a 3 dB waveguide splitter 90 to form a polarization-diversified coherent receiver. Two waveguides 92 and 94 are formed. Within the detectors 86 and 88, the waveguides have the form 70 illustrated in FIGS. 4 and 5, but away from the detectors 86 and 88 they have the simpler cross section illustrated in FIG. 8. The substrate 50, the n+ lower contact layer 52, and the p-type lower layer 54 are the same as for the detectors 58 and 64 as illustrated in FIG. 5. However, the upper portion of the lower waveguide layer 56 is formed into a 3 μm ridge 98 and is then covered with a layer 100 of semi-insulating InP to form a buried ridge waveguide 92 or 94. As is conventional, the two buried ridge waveguides 92 and 94 are brought close together to form the 3 db splitter 90. A typical length and separation of the waveguides 92 and 94 within the splitter 90 are about 1 mm and 2 μm.

Each of the polarization-diversified detectors 86 and 88 contains a polarized waveguide detector 58 and a conventional waveguide detector 64, as illustrated in FIGS. 4 and 5. The two pairs of electrical leads 82 and 84 carry the photosignals $I_1$, $I_2$, $I_3$, and $I_4$ represented in Equations (1), (2), and (3). A local-oscillator (LO) laser 102 can be integrated on the same chip and attached to the input of one waveguide 94. The LO laser 102 should output equal amounts of TE and TM radiation and should be wavelength tunable, which may be accomplished by a three-terminal distributed feedback (DFB) laser. Its control is performed by unillustrated circuitry. Such a design provides a high level of integration.

Figure 9:
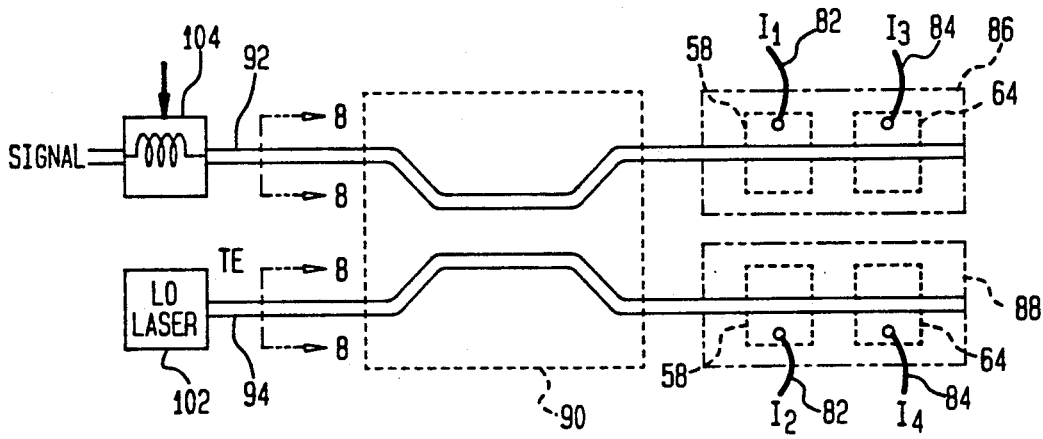
FIGS. 9 and 10 are combined plan and schematic views of two alternative embodiments of integrated coherent receivers.
Figure 10:
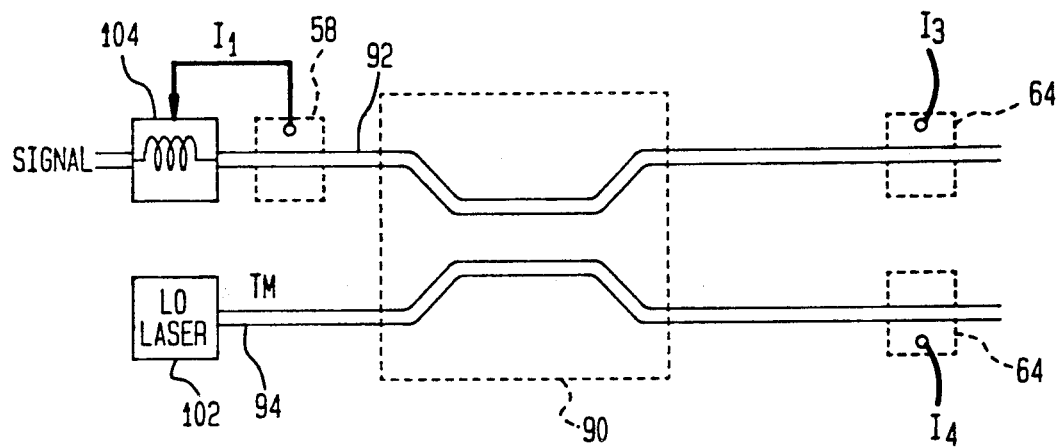

However, the typical DFB laser produces only one mode of light, usually the TE mode, while the LO laser 94 should be outputting a mode set at 45° between the TE and TM modes. The preferential TE lasing arises in the conventional edge-emitting lasers because both the optical confinement factor in the active layer and the mirror reflectivity are larger for the TE mode. As will be shown later, however, a TM-mode laser can be achieved. Nontheless, somewhat similar effects can be achieved although a balanced-output polarization-diversified receiver is not achieved. As illustrated in plan view in FIG. 9, the LO laser 102 is a conventional edge-emitting laser outputting TE radiation. The polarization state of the input signal is controlled to be TE with a polarization controller 104. Whatever TM radiation is detected by either TM detectors 86 and 88 corresponds to incomplete input-state control so that either $I_3$ or $I_4$ drives the polarization controller 104 so as to minimize itself. Thereby, the orthogonal signal $I_1-I_2$ is maximized to provide the balanced detection output. An alternative integrated coherent receiver is illustrated in FIG. 10 in which only conventional waveguide detectors 64 are used after the 3 dB splitter 90. However, the polarized waveguide detector 58 is placed between the polarization controller 104 and the splitter 90 and is used to control the polarization controller 104. The LO laser 102 is one that outputs the TM mode. The TE output $I_1$ drives the polarization controller 104 so as to minimize itself while the orthogonal TM-output difference $I_3-I_4$ is thereby maximized so as to be the balanced detection output.

However, in general, polarization controllers 104 require high driving voltages of ∼50 V, which are difficult to integrate on chip. Therefore, it would be preferable to instead use a dual-polarization wavelength-tunable semiconductor laser source for the local oscillator 102. One method of achieving such a source uses similar principles as the polarization-diversity detector with an additional understanding of the polarization dependence of the gain under current injection. As has been disclosed by Yamanishi et al. in "Comment on polarization dependent momentum matrix elements in quantum well lasers," Japanese Journal of Applied Physics, volume 23, 1984, pages L35–L36, the relative values of the square of the momentum matrix elements $M=\mu^2$ for quantum-well lasers are given by:

$$M_{TE}^{ehh}:M_{TM}^{ehh}:M_{TE}^{elh}:M_{TM}^{elh} = \frac{3}{4}:0:\frac{1}{4}:1, \quad (9)$$

where the superscripts (ehh) and (elh) indicate the electron/heavy-hole and electron/light-hole transitions respectively and the subscripts indicate the polarizations TE and TM. That is, the TM gain for the electron/light/hole transition (elh) has the largest transition matrix element. The gain for a forward biased diode laser is proportional to M. Under biaxial tensile strain, the light-hole band 38 is raised above the heavy-hole band 36. If this seperation $-\Delta_{hh-lh}$ can be made sufficiently larger than 2 kT (52 meV) by biaxial tensile strain, the larger TM gain can overcome the larger TE confinement and reflectivity so that the laser produces TM polarized output. Since the actual separation $-\Delta_{hh-lh}$ under biaxial tensile strain is reduced by the quantum-size effect, a thick quantum well is preferred.

Figure 11:
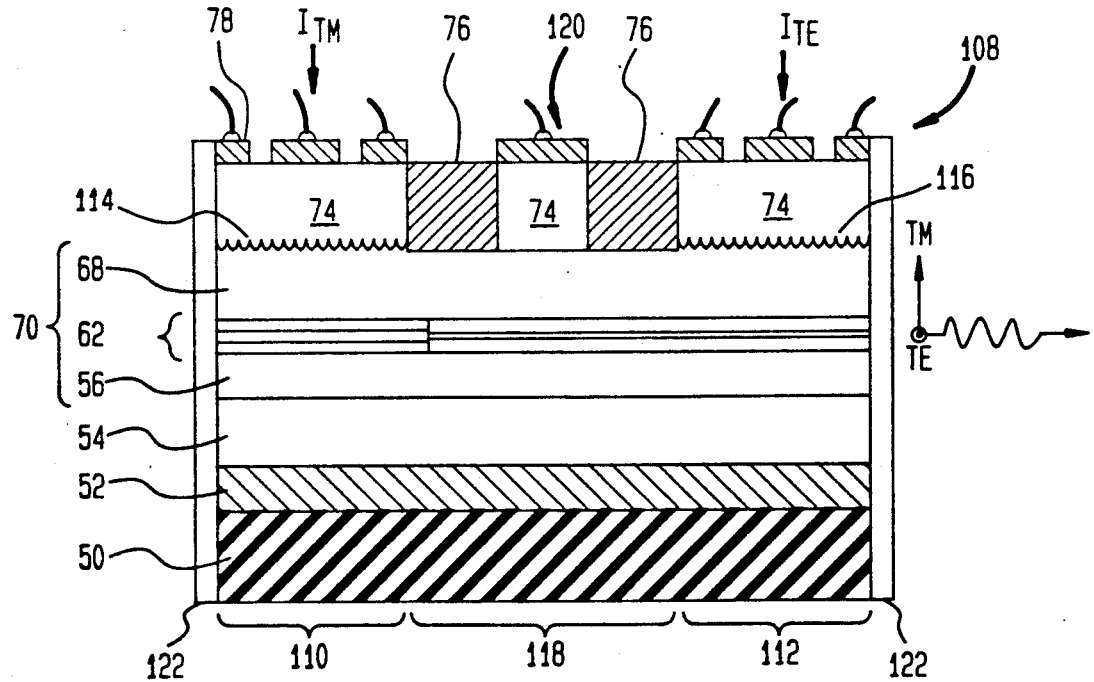
FIG. 11 is a cross-sectional view of a polarization-multiplexed laser transmitter.

As illustrated in cross section in FIG. 11, a TM polarized DFB laser 110 and a TE polarized DFB laser 112 may be formed on the common waveguide 70. The TM polarized laser 110 includes a biaxially tensilely strained quantum well while the TE polarized laser 112 includes compressively strained multiple quantum wells in the active layer 62. For example, assuming that the other layers are latticematched to InP, the biaxially tensilely strained quantum well of $In_xGa_{1-x}As$ could have an alloying fraction x=0.4 while the biaxially compressively strained quantum well could have x=0.78. The active layer 62 for the TE polarized laser 112 closely follows that for the TE detector 58 of FIG. 4. Of course, laser diodes are operated with forward bias, while diode detectors are reversed biased.

The structure of the separate lasers 110 and 112 closely resembles the laser disclosed by Zah et al., in "Performance of 1.5 μm λ/4-shifted DFB-SIPBH laser diodes with electron beam defined and reactive ion-etched gratings," Electronics Letters, volume 25, 1989, pages 650–651. The required feedback to achieve lasing in each laser section 110 or 112 is provided by gratings 114 and 116 with a λ/4 phase shift in their middles such that each laser 110 or 112 emits light at its Bragg wavelength given by $$\lambda_B = 2n_e \Lambda, \tag{10}$$

where Λ is the physical period of the respective grating 110 or 112 and $n_e$ is the effective refractive index of the waveguide 62 for that grating. In general, the effective refractive indices of the two polarizations TE and TM are different even for the same waveguide. Therefore, both lasers 110 and 112 can lase at the same wavelength $\lambda_B$ without one laser's grating optically interfering with the other laser. The wavelengths of lasers 110 and 112 can be tuned by the use of three separate current electrodes 78 for each laser as well as the common counter electrode on the lower contact layer 52.

The TM light propagating to the right from the TM polarized laser 110 can pass through the biaxially compressively strained TE polarized laser 112 without being absorbed. However, the TE light propagating to left from the TE polarized laser 112 is absorbed in an intermediate isolation region 118, which contains the biaxially compressively strained multiple quantum wells and is kept grounded by a separate electrode 120 isolated from the lasers 110 and 112 by the regrown semi-insulating InP regions 76. If the lasers 110 and 112 are formed as a discrete combination, anti-reflection coatings 122 should be applied to the opposed facets to prevent optical feedback. On the other hand, the illustrated pair of lasers 110 and 112 can also be incorporated as the LO laser 102 in the coherent polarization-diversified receiver of FIG. 4. The currents of the two lasers 110 and 112 would be tuned so as to produce equal amounts of TE and TM outputs. The combination of TE and TM polarized lasers 110 and 112 on a common waveguide 70 with separate current electrodes also provides the ability to polarization-multiplex two data signals at the same (or different) wavelength on a waveguide or fiber.

EXAMPLE 2

The concept of the biaxially tensilely strained TM polarized laser was verified with a 1.55 μm laser. The active layer was a single tensilely strained quantum well of $In_xGa_{1-x}As$ in the middle of the GRINSCH waveguide made undoped on each side of 145 nm of 1.0 μm quaternary, 145 nm of 1.1 μm quaternary, and 10 nm of 1.2 μm quaternary. The quantum-well thickness was about 20 nm and the amount of strain in the well was about 0.9% in tension, corresponding to x=0.4. The laser was observed to emit TM radiation with a lasing threshold of 200 A/cm$^2$.

Figure 12:
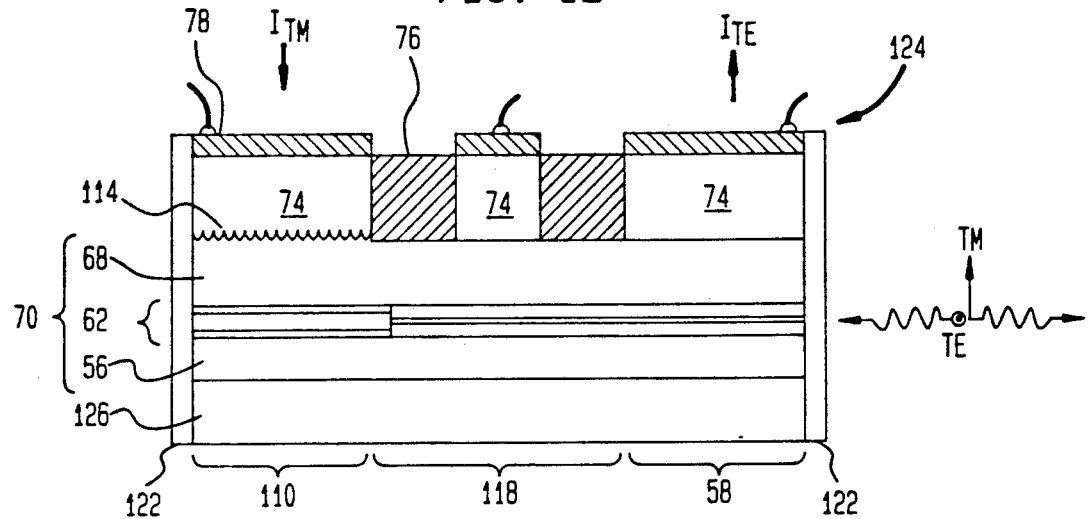
FIG. 12 is a cross-sectional view of a polarization-multiplexed transceiver.

The embodiments of FIGS. 4 and 11 can be combined to form a transceiver formed on a single waveguide that transmits a signal at one polarization and detects another signal at the orthogonal polarization. One embodiment of such a transceiver 124 is illustrated in cross section in FIG. 12. A discrete transceiver 124 is shown having a conducting InP substrate 126 electrically contacted at its rear. The left side of the waveguide 70 is formed with the TM polarized laser 110, similarly to FIG. 9, and is forward biased. Its active layer 62 contains a biaxially tensilely strained single quantum well. The grating 114 provides distributed feedback so as to produce TM polarized radiation. On the other hand, the right side of the waveguide 70 is formed with the TE detector 58, similarly to FIG. 4, is reversed biased, and has no distributed-feedback grating. Its active layer 62 and that of the isolation region 118 contain biaxially compressively strained multiple quantum-well layers. The TM light produced in the TM polarized laser 110 can traverse the isolation region 118 and TE polarized detector 58 without absorption, while the absorption region 118 absorbs any rightwardly propagating spontaneous TE light. The transceiver 124 can detect TE polarized light propagating to the left and produces TM polarized light propagating to the right, and these two polarization modes may be of the same frequency. The waveguide 70 may be coupled on its right to a polarization-maintaining optical fiber or into a waveguide formed in a larger opto-electronic integrated circuit of which the transceiver 124 is a part.

A variant of the transceiver 124 places the grating on the right rather than the left, that is, places the conventional detector 64 of FIG. 4 on the left and the TE polarized laser 112 of FIG. 11 on the right. Alternately, the left-side detector may include a biaxially tensilely strained single quantum well in its active layer. Such a transceiver, when coupled to a fiber or waveguide on the right, detects TM radiation and produces TE radiation. These two types of transceivers can be paired on opposite ends of a communication waveguide.

Figure 13:
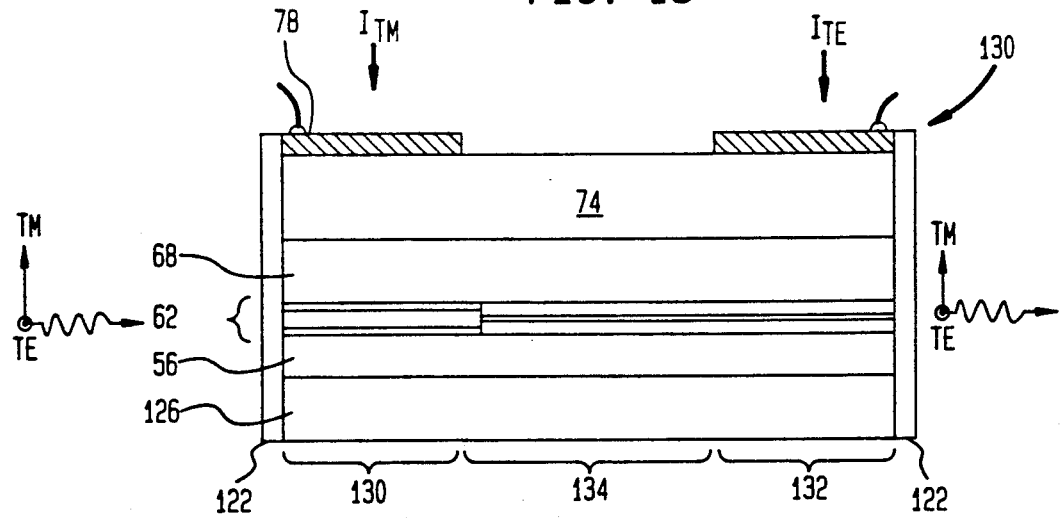
FIG. 13 is a cross-sectional view of polarization-independent optical amplifier.

An optical amplifier is principally distinguished from a laser by its lack of feedback. As a result, the dual-polarization laser 108 of FIG. 11 may be modified to a broadband polarization-insensitive optical amplifier 130, illustrated in FIG. 13, by removing the gratings 114 and 116. A signal containing both TE and TM polarizations is received from the left. A TM optical amplifier 130 positioned on the side of the input includes a biaxially tensilely strained single quantum well in its active layer 62. It is biased in the forward direction to provide optical gain mainly for the TM radiation. A TE optical amplifier 132 is positioned on the side of the output, and its active layer 62 includes compressively strained or unstrained multiple quantum wells or even a bulk active layer. Because of the biaxial compressive strain or the natural preference for TE amplification, the TE optical amplifier 132 provides the optical gain mainly for the TE radiation. The two amplifier sections 130 and 132 are separated by a small isolation region 134 having the same structure as the TE amplifier except the lack of current drive. The amplified signal containing both TE and TM components is output to the right. By proper selection of the length for each section and by adjusting the amount of current $I_{TM}$ and $I_{TE}$ into each laser section 130 and 132, the gain for the two polarizations TE and TM can be made the same, thus providing a polarization-insensitive optical amplifier. If quantum-well active layers are used in both sections 130 and 132, the optical bandwidth and the output saturation power are larger than those for the bulk active layer (and also for optical fiber amplifiers) due to the step-like density of states in quantum wells. To obtain high optical gain, the cavity lengths should be made long, and anti-reflection coatings 122 should be placed on angled facets of a flared waveguide, as disclosed by the present inventor in U.S. Pat. No. 4,965,525, in order to minimize the optical feedback.

Although the above embodiments have been based on the InP material family, the invention applies equally to other III-V semiconductors and in particular to the GaAs material family.

The detector and amplifier of the invention are structurally distinguished principally by the power source driving them with a detector being reversed-biased and an amplifier and laser being forward biased. Forward biasing is achieved by connecting the electrodes to a current source such that positive voltage is applied to the p-side electrode. Reverse biasing is achieved by putting the electrodes in parallel to both a power circuit and a load resistor across which the detected voltage is measured or used. The power circuit usually includes a coupling capacitor in series with a parallel connection of a reversed-biased diode on one side and serially connected limiting resistor and voltage source on the other side. The power circuit applies positive voltage to the n-side electrode for reverse biasing. Other forward and reverse biasing means are well known in the art.

What is claimed is:

1. A polarized opto-electronic system, comprising:
   a waveguide formed in and laterally defined within the surface of a substrate for carrying light having a characteristic energy;
   a first opto-electronic device formed adjacent to a first portion of said waveguide and including an active strained quantum-well layer interacting with said light and having a first transition energy for light of a first polarization and having a second transition energy for light of a second orthogonal polarization, said characteristic energy falling between said first and second transition energies; and
   a second opto-electronic device formed adjacent to a second portion of said waveguide and including an active layer having different strain characteristics than said strained quantum-well layer of said first opto-electronic device.

2. A polarized opto-electronic system as recited in claim 1, wherein said second opto-electronic device includes an active quantum-well layer.

3. A polarized opto-electronic system as recited in claim 2, wherein said quantum-well layer in said second opto-electronic device is strained oppositely from said strained quantum-well layer of said first opto-electronic device.

4. A dual-polarization laser including the polarized opto-electronic system recited in claim 3, wherein said first and second opto-electronic devices further comprise optical feedback means and further comprising biasing means for biasing said first and second opto-electronic devices as lasers.

5. A dual-polarization optical amplifier including the polarized opto-electronic system recited in claim 1 and further comprising biasing means for biasing said first and second opto-electronic devices as optical amplifiers.

6. A polarization-multiplexed transceiver including said polarized opto-electronic system recited in claim 1, wherein a first one of said first and second opto-electronic devices includes optical feedback means and further comprising biasing means for biasing said first one as a laser and for biasing a second one of said first and second opto-electronic devices as a detector.

7. A polarization-diversified detector, comprising:
   a waveguide formed in the surface of a substrate for carrying light having a characteristic energy;
   a first opto-electronic device formed adjacent to a first portion of said waveguide and including an active strained quantum-well layer interacting with said light and having a first transition energy for light of a first polarization and having a second transition energy for light of a second orthogonal polarization, said characteristic energy falling between said first and second transition energies;
   a second opto-electronic device formed adjacent to a second portion of said waveguide and including an active layer having different strain characteristics than said strained quantum-well layer of said first opto-electronic device; and
   biasing means to bias said first and second opto-electronic devices as first and second detectors, and
   wherein said waveguide receives said light on a first side of said first detector and said second detector is disposed on said waveguide on a second side of said first detector.

8. A polarization-diversified detector as recited in claim 7, wherein said active layer of said second detector includes no strained quantum-well layer.

9. A polarization-diversified detector as recited in claim 7, wherein said active layer of said second detector includes a quantum-well layer strained oppositely from said strained quantum-well layer of said first detector.

10. A coherent polarization-diversified receiver, comprising:
    a first polarization-diversified detector as recited in claim 7 whose waveguide has an input end for receiving an input signal;
    a local-oscillator laser;
    a second polarization-diversified detector as recited in claim 7 whose waveguide has an input end coupled to an output of said local-oscillator laser; and
    an optical coupler for optically coupling said waveguides of said first and second polarization-diversified detectors and disposed between said input ends and said opto-electronic devices.

11. An optical pickup, comprising:
    a substrate;
    a semiconductor laser formed in said substrate and emitting light from a periphery of said substrate;
    an optical waveguide formed in said substrate and extending from said periphery to a central portion of said substrate;
    a first optical detector formed adjacent to a first linear portion of said waveguide;
    a second optical detector formed adjacent to a second linear portion of said waveguide, wherein said first and second optical detectors have differing sensitivities to at least one polarization state of light propagating in said waveguide; and
    electrical processing means for comparing outputs of said first and second optical detectors to thereby determine a polarization rotation of said light emitted by said laser.

12. An optical pickup as recited in claim 11, wherein said first optical detector has a first active layer having a quantum well in compressive strain and wherein said second optical detector has a second active layer with different strain characteristics than said first active layer.

13. An optical pickup as recited in claim 12, wherein said second active layer is substantially unstrained.

14. An optical pickup as recited in claim 12, wherein said second active layer has a quantum well in biaxial tensile strain.

* * * * *

UNITED STATES PATENT AND TRADEMARK OFFICE
CERTIFICATE OF CORRECTION

PATENT NO. : 5,117,469

DATED : May 26, 1992

INVENTOR(S) : Kwok-wai Cheung and Chung-en Zah

It is certified that error appears in the above-identified patent and that said Letters Patent is hereby corrected as shown below:

```
    In the Abstract, line 17, change "comined" to read --combined--.
Column 3, line 61, "T" should read --Γ--.
Column 8, line 41, "light/hole" should read --light-hole--;
        line 59, "latticematched" should read --lattice-matched--.
```

Signed and Sealed this

Fourteenth Day of September, 1993

*Attest:*

BRUCE LEHMAN

*Attesting Officer*     Commissioner of Patents and Trademarks